United States Patent [19]
Xu et al.

[11] Patent Number: 6,067,001
[45] Date of Patent: May 23, 2000

[54] METHOD FOR DESIGNING ELECTROMAGNETS HAVING ARBITRARY GEOMETRICAL CONSTRAINTS

[75] Inventors: Hao Xu, Sunnyvale; Steven M. Conolly, Palo Alto, both of Calif.

[73] Assignee: The Board Trustees of the Leland Stanford Junior University, Palo Alto, Calif.

[21] Appl. No.: 09/316,738
[22] Filed: May 21, 1999

Related U.S. Application Data

[63] Continuation of application No. 09/046,946, Mar. 23, 1998.
[51] Int. Cl.[7] ................................................. H01F 5/00
[52] U.S. Cl. ............................... 335/299; 324/319
[58] Field of Search ................... 335/216, 296–301; 324/318–320

[56] References Cited

U.S. PATENT DOCUMENTS

| | | | |
|---|---|---|---|
| 5,631,618 | 5/1997 | Trumper et al. | 335/299 |
| 5,642,087 | 6/1997 | Crow | 335/216 |

*Primary Examiner*—Lincoln Donovan
*Assistant Examiner*—Raymond Barrera
*Attorney, Agent, or Firm*—Lumen Intellectual Property Services

[57] ABSTRACT

A very flexible method for designing electromagnets which produce an arbitrary magnetic field. The conductors of the magnet can be constrained to an arbitrary surface or volume. The method provides the lowest power (or shortest wirelength) design given constraints on the desired magnetic field and constraints on where the coils can be located with respect to the desired magnetic field. The method begins with establishing a mesh of nodes and current elements connecting the nodes. The mesh can have any 2 or 3 dimensional shape (e.g. a rectangular grid on a cylinder). The magnet conductors can only be located where current elements are defined. A number of target points are established and a desired magnetic field is defined for each target point. Next, a matrix of coefficients is defined which relates the current in each current element with the magnetic field at each target point. Also, a total power expression is defined for the power consumed in the current elements. Finally, a constraint is provided which enforces Kirchoff's current law at the nodes. A linear programming (LP) problem is then defined in matrix form. In the LP problem, the total power expression is minimized subject to the constraints of the desired magnetic field at the target points, and Kirchoff's law. The result provides the necessary current in each of the current elements. Magnet conductors are built which correspond to the current elements having nonzero current.

14 Claims, 4 Drawing Sheets

METHOD FOR DESIGNING ELECTROMAGNETS HAVING ARBITRARY GEOMETRICAL CONSTRAINTS

RELATED APPLICATIONS

This application is a continuation of patent application Ser. No. 09/046,946 filed on Mar. 23, 1998 by the present inventors discloses a similar method for designing homogeneous field magnets for magnetic resonance imaging.

STATEMENT REGARDING FEDERALLY SPONSORED RESEARCH OR DEVELOPMENT

This invention was made with Government support under contract CA79728-01 awarded by the National Institute of Health. The Government has certain rights in the invention.

FIELD OF THE INVENTION

This invention relates generally to methods for designing electromagnets. The method is particularly useful in designing gradient coils for magnetic resonance imaging.

BACKGROUND OF THE INVENTION

Magnetic resonance imaging (MRI) is a common and well known technique for imaging the internal structure of objects and for medical diagnosis. MRI requires that the object to be imaged be placed in a uniform (typically to within 1 ppm) and strong (typically in the range of 0.5 to 1.5 Tesla) magnetic field.

Magnetic resonance imaging also requires gradient fields for altering slightly the strong, homogeneous field as a function of location. For 3-dimensional imaging, switched gradient fields must be provided in the X, Y and Z directions. Specially designed gradient coils are used to provide the gradient fields. One gradient coil is required for each dimension, so for 3-dimensional imaging, 3 gradient coils are needed.

Typically, the gradient coils are located within the bore of the homogeneous magnet and around the object to be imaged. This places certain geometrical constraints on the shape and size of the gradient coils. For imaging the spine, for example, the gradient coil must fit around the body. For imaging the head, the gradient coil must fit around the head. Typically, gradient coils are located on a cylindrical surface or biplanar surface. However, this may not be the best shape for many body parts. Some body parts are obviously not cylindrical and it may be better to have a gradient coil that more closely resembles the shape of the body part to be imaged. In the present state of the art, there exist a few methods for designing gradient coils constrained to arbitrarily shaped surfaces. Conjugate gradient descent and simulated annealing are two examples. However, these gradient coil design methods tend to be slow computationally. It would be an advance in the art to provide a method for designing gradient coils on arbitrarily shaped surfaces that is computationally faster.

Homogeneous magnets have a certain 'field of view' (FOV) where the homogeneous magnetic field is suitable for magnetic resonance imaging. Similarly, gradient coils have an FOV where the gradient field is suitable for imaging. Imaging can only be provided in a volume where the homogeneous magnet FOV and gradient coil FOV overlap. Some homogeneous magnets have a FOV which is substantially nonspherical (e.g. an oblate or prolate spheroid). In such cases it is best for the FOV of the gradient coil to closely match the FOV of the homogeneous magnet. However, in the present state of the art, it is not clear how to efficiently design gradient coils having a FOV of arbitrary shape.

Furthermore, in the present state of the art it is not clear how to simultaneously provide the features of fast computation speed, an ability to design on arbitrarily shaped surfaces, and an ability to provide an arbitrarily shaped FOV. It would be an advance in the art of MRI and magnet design to provide a method which provides all these desirable features simultaneously.

OBJECTS AND ADVANTAGES OF THE INVENTION

Accordingly, it is a primary object of the present invention to provide a method for designing electromagnets that:

1) can design electromagnets constrained to an arbitrarily shaped surface;
2) can design gradient coils that provide an arbitrarily shaped field of view;
3) is computationally very fast;
4) provides electromagnets which consume minimum power given the geometric constraints and magnetic field requirements;
5) can design electromagnets constrained to a cylinder of a predetermined length;
6) can design a biplanar electromagnet of predetermined size.

These and other objects and advantages will be apparent upon reading the following description and accompanying drawings.

SUMMARY OF THE INVENTION

These objects and advantages are attained by a method for making an electromagnet according to the present invention. In the present method, a mesh of current nodes and current elements are defined. The current elements are connected between the current nodes. Next, a number of target points are defined, and a desired magnetic field is defined for each target point. A power expression is defined. The power expression has the form:

$$\sum_{k=1}^{K} L_k |i_k|,$$

where $L_k$ is a length of each candidate current element and $i_k$ is a current in each candidate current element. Next, a magnetic field constraint is defined for each target point, establishing a maximum allowable deviation from the desired magnetic field. Next, a constraint is defined which enforces Kirchoff's current law (i.e. that the net current at each node must be zero). Next, a calculation is established equivalent to a L1-norm minimization calculation where the power expression is minimized subject to the magnetic field constraint and subject to the Kirchoff's current law. Then, the L1-norm minimization calculation is solved, providing the currents $i_k$ for each of the current elements. Finally, conductors are built in locations corresponding to the current elements specified as having nonzero current.

The mesh may be formed in the shape of a cylindrical surface, or in 3-dimensional space. The mesh may comprise a rectangular grid of nodes and current elements, or a hexagonal array or nodes and current elements, for example. Also, the current elements may be curved or straight.

Certain target points outside the mesh can have a maximum allowable magnetic field.

DETAILED DESCRIPTION

The present invention provides a flexible technique for designing magnets having conductors constrained to arbitrarily shaped surfaces. The design technique produces magnet designs that provide arbitrary magnetic fields, including MRI gradient fields in an arbitrarily shaped field of view. The present method is computationally efficient and therefore requires very little computer time. The method can be performed using a wide variety of linear programming software applications.

Figure 1A:
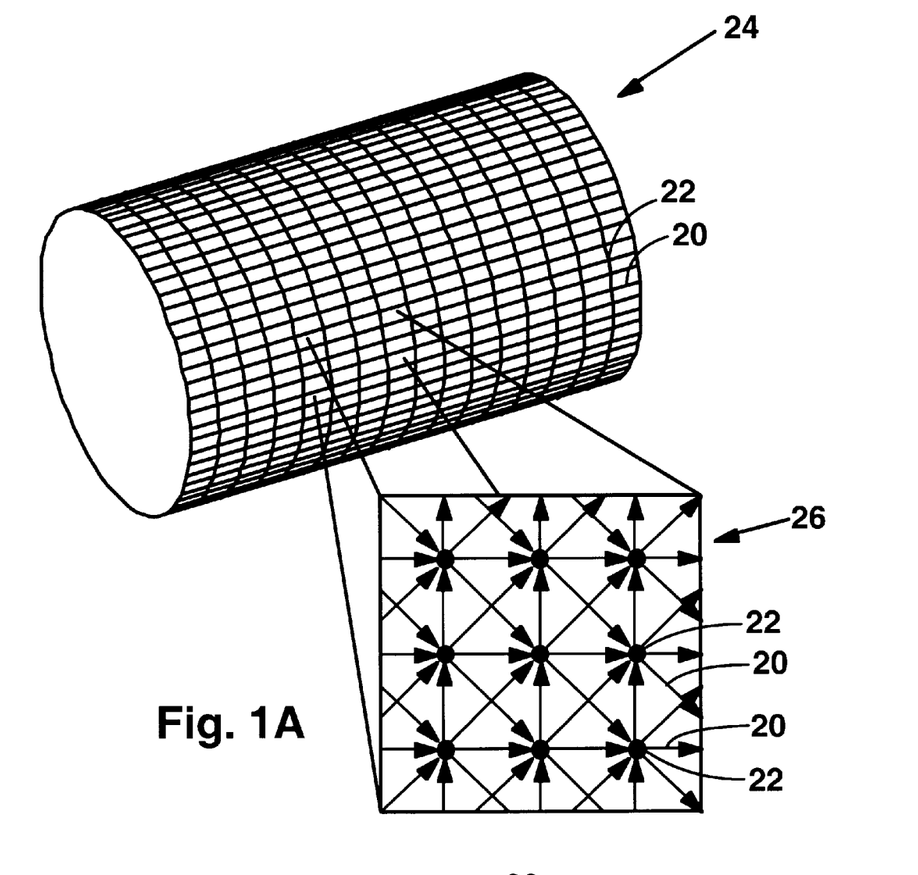
FIG. 1A shows a mesh cylinder of current elements and nodes used in the calculations of the present invention.

FIG. 1A shows a starting mesh of candidate current elements 20 and current nodes 22 used in a preferred method of the present invention. The mesh is disposed in a cylindrical shape 24. The current elements 20 are arranged in a rectangular grid including diagonal current elements. Preferably, the current elements 20 are modeled as straight conductors approximating the cylindrical shape; alternatively the current elements are modeled as curved conductors fitting perfectly to the cylindrical shape 24. The nodes 22 are defined as locations where the current elements intersect. In the present method, the magnet design is complete when current values and directions are determined for each of the current elements 20.

A magnified section 26 of the mesh illustrates the layout of the nodes 22 and current elements 20. Each current element 20 has a designated current direction.

Figure 1B:
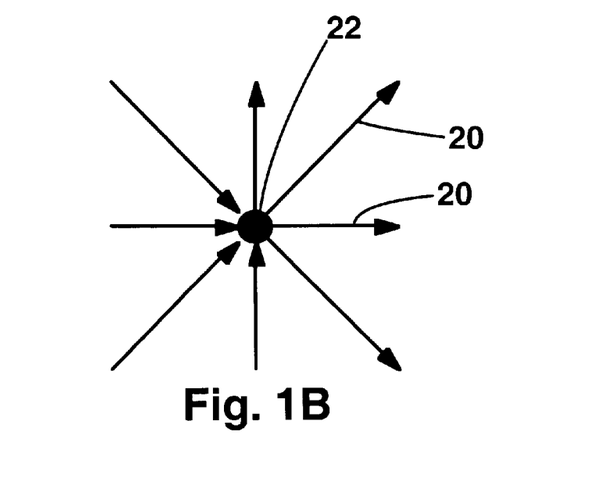
FIG. 1B shows designated positive current directions in the current elements.

FIG. 1B shows a single current node 22 and the current elements 20 connected to the single node. The node and current elements of FIG. 1B comprise a 'unit cell' of the mesh shown in FIG. 1A.

The candidate current elements 20 are arbitrarily numbered 1,2, 3, . . . , K. An unknown current variable is selected for each current element. The unknown currents are numbered $i_1, i_2, i_3, \ldots, i_K$ for the candidate current elements 1, 2, 3, . . . , K, respectively. The currents $i_1, i_2, i_3, \ldots i_K$ are variables to be determined in the following calculations. The magnet design is complete when the currents $i_1, i_2, i_3, \ldots i_K$ are determined for all the current elements. The currents $i_1, i_2, i_3, \ldots i_K$ may have any value and magnitude: zero, positive or negative. A negative current value for a current element indicates that the current travels in a reverse direction from that shown in FIG. 1A. In designing an actual gradient coil, K can have a value of 1000 or more, for example. The mesh has N current nodes 22.

Each candidate current element represents a portion of a current-carrying conductor that may or may not exist in the final magnet when constructed. A particular candidate current element will have a corresponding current element in a constructed magnet apparatus if the present method prescribes a nonzero current for the particular candidate current element.

Figure 2A:
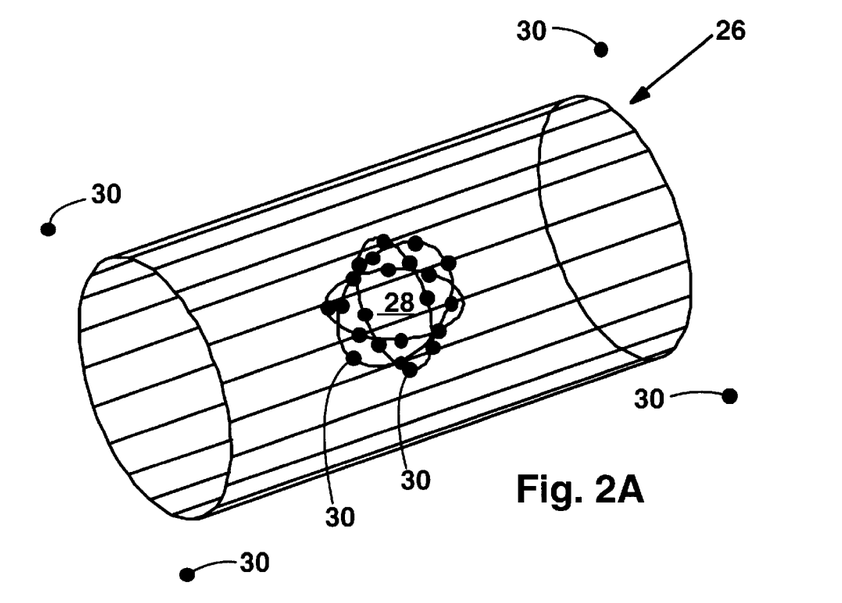
FIG. 2A shows a group of target points within and outside the mesh cylinder of current elements and nodes.

FIG. 2A illustrates the next step of the present method. For clarity, the mesh is not shown in FIG. 2A. The cylindrical shape 26 is illustrated without the current elements or current nodes. A field of view 28 is located within the cylindrical shape 26 (the field of view can also be located outsie the cylindrical shape). The field of view 28 is the volume where a certain magnetic field is desired. A number M of target points 30 are defined around the field of view 28. Target points may also be defined within the field of view 28. The target points 30 are arbitrarily numbered 1,2,3, . . . ,M. A desired magnetic field $b_1, b_2, b_3, \ldots, b_M$ is defined at each target point. The desired magnetic fields $b_1, b_2, b_3, \ldots, b_M$ characterize the magnetic field within the field of view. In a typical magnet design calculation, M can have a value of 50 or 100 for example. Also, a maximum acceptable deviation from the desired magnetic field is defined for each target point. The maximum deviation at each target point is numbered $e_1, e_2, e_3, \ldots e_M$.

The target points 30 are preferably also located outside the cylinder 26. Target points outside the cylinder can be used to specify a maximum allowable magnetic field far from the cylinder 26. When used for designing MRI gradient coils, target points outside the mesh can be used to set limits on eddy currents in nearby metal components.

Also, target points outside the mesh can be used to specify gradient fields outside a volume enclosed by a small gradient coil. For example, a gradient coil may be located in an interventional device so that imaging is provided in a volume surrounding the interventional device.

Figure 2B:
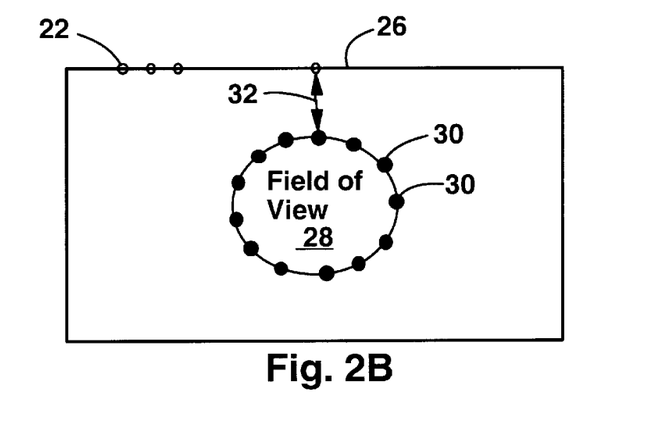
FIG. 2B shows a cross sectional view of the mesh cylinder, field of view and target points lying with the cross sectional plane.

FIG. 2B shows a cross sectional view of FIG. 2A. It is noted that for MRI transverse gradient coils, the target points 30 must be located around a three dimensional volume (i.e., not located in plane or on a line).

In the preferred embodiment of the present method, the current elements are idealized as being filamentary, linear currents. In order to avoid errors due to the idealization of assuming the current elements 20 to be filamentary, the current elements should be located a minimum distance 32 away from the target points 30. The minimum distance 32 between the current elements 30 and target points 30 should be about 4–5 times a diameter (or cross-sectional dimension) of the physical conductors used in making the magnet. Also, increasing the relative distance between the current elements 20 and target points 30 may increase the accuracy of the final magnet design. This can be done, for example, by using a denser collection of nodes 22 and current elements 20.

Each candidate current element 20 represents a length of conductor that may or may not exist in the final magnet when constructed. A particular current element will have a corresponding conductor length in the final magnet apparatus if the following calculations prescribe a nonzero current for the particular current element 20.

The total power dissipation (Power=$I^2R$) in a magnet as a function of current and current element geometry is equal to the expression:

$$\text{Total Power} = \sum_{k=1}^{K} |i_k|^2 \left( \frac{L_k}{\sigma_c A_k} \right),$$

where $i_k$ is the current in the $k^{th}$ current element, $L_k$ is the length of the $k^{th}$ current element, $A_k$ is the cross sectional area of the $k^{th}$ current element and $\sigma_c$ is the conductivity of the current element conductor material.

By assuming all the current elements have the same current density, the total power expression can be simplified. Since $$\frac{|i_k|}{A_k} = J = \text{Constant},$$

where J is the current density, the factor J can be extracted from the summation in the power expression. Therefore, for a given constant current density J, the power expression can be simplified to:

$$\text{Total Power} = \left( \frac{J}{\sigma_c} \right) \sum_{k=1}^{K} |i_k| L_k.$$

It is important to note that the total power expression is linear in the magnitude of $i_k$. This is a direct result of constraining the current elements to have identical current densities.

Next, numerical coefficients are calculated which define the proportionality constant between the current in each current element and the magnetic field at each target point 30. The coefficients are calculated using the well known Biot-Savart law. With M target points and K candidate current elements there are M×K coefficients relating current in the elements to the magnetic field at the M target points; the coefficients are labeled $a_{m,k}$. The coefficient $a_{m,k}$ is the proportionality constant between the current in the $k^{th}$ current element and the magnetic field at the $m^{th}$ target point (e.g. coefficient $a_{5,4}$ relates the current in the $4^{th}$ current element to the magnetic field at the $5^{th}$ target point). The coefficients $a_{m,k}$ depend upon the exact locations of the current elements 20 and target points 30. A unit current through the $k^{th}$ current elements creates a field $a_{m,k}$ at the $m^{th}$ target point.

The net magnetic field in each direction at each target point 30 can be expressed as a sum of the contributions from each current element.

Magnetic field at $m^{th}$ target point=$i_1 a_{m,1} + i_2 a_{m,2} + i_3 a_{m,3} + i_4 a_{m,4} + \ldots i_K a_{m,K}$, where K is the total number of current elements. The quantities I, and coefficients $a_{m,k}$ can be in vector form.

Once the coefficients $a_{m,k}$ are calculated for a particular combination of target points and current elements, a M×K coefficient matrix A relating the currents in all the current elements with the fields at all the target points can be written. Matrix A has the form:

$$A = \begin{pmatrix} a_{1,1} & \cdots & a_{1,K} \\ \vdots & \vdots & \vdots \\ a_{M,1} & \cdots & a_{M,K} \end{pmatrix}.$$

The unknown currents $i_1, i_2, i_3, \ldots i_K$ are written as a vector I which has the form:

$$I = \begin{pmatrix} i_1 \\ i_2 \\ i_3 \\ \vdots \\ i_K \end{pmatrix}.$$

The desired magnetic fields $b_1, b_2, b_3, \ldots, b_M$ at the target points are written as a vector B which has the form:

$$B = \begin{pmatrix} b_1 \\ b_2 \\ b_3 \\ \vdots \\ b_M \end{pmatrix}.$$

Therefore, if exact solutions are required, we seek currents $i_1, i_2, i_3, \ldots i_K$ which satisfy the relation:

$$\begin{pmatrix} a_{1,1} & \cdots & a_{1,K} \\ \vdots & \vdots & \vdots \\ a_{M,1} & \cdots & a_{M,K} \end{pmatrix} \begin{pmatrix} i_1 \\ i_2 \\ \vdots \\ i_K \end{pmatrix} - \begin{pmatrix} b_1 \\ b_2 \\ \vdots \\ b_M \end{pmatrix} \approx 0, \text{ or equivalently}$$

$$|A * I - B| \approx 0.$$

Generally, there is a tolerance allowed in the desired magnetic field. Therefore, the above equation can be rewritten as:

$$\left| \begin{pmatrix} a_{1,1} & \cdots & a_{1,K} \\ \vdots & \vdots & \vdots \\ a_{M,1} & \cdots & a_{M,K} \end{pmatrix} \begin{pmatrix} i_1 \\ i_2 \\ \vdots \\ i_K \end{pmatrix} - \begin{pmatrix} b_1 \\ b_2 \\ \vdots \\ b_M \end{pmatrix} \right| \leq \left| \begin{pmatrix} e_1 b_1 \\ e_2 b_2 \\ \vdots \\ e_M b_M \end{pmatrix} \right|, \text{ or equivalently}$$

$$|A * I - B| \leq |EB|,$$

where $e_1, e_2, e_3, \ldots e_M$ are the maximum allowable fractional deviations from the desired magnetic fields $b_1, b_2, b_3, \ldots, b_M$, and EB expresses the deviations in vector form. The inequality ($|A*I-B| \leq |EB|$) is termed the magnetic field constraint. In certain designs $e_1 = e_2 = \ldots = e_M$ if the fractional tolerance is the same for every target point. If it is desired to produce a magnet having a magnetic field less than a certain maximum value far from the magnet, the $e_k$ tolerances for target points outside the magnet can be used to specify the maximum allowable field.

A necessary constraint in the present method is that the net current at each node 22 must sum to zero (Kirchoff's current law). This constraint is not implicit in any of the equations introduced so far. Therefore, in order to assure that the magnet design provided by the present method is physically possible, a constraint based on Kirchoff's law must be introduced. This is accomplished by defining a N×K matrix Q as follows (N is the number of nodes):

$$Q = \begin{pmatrix} q_{1,1} & \cdots & q_{1,K} \\ \vdots & \vdots & \vdots \\ q_{N,1} & \cdots & q_{N,K} \end{pmatrix}$$

where:

$q_{n,k}$=1 if the $k^{th}$ current element is directly connected to the $n^{th}$ node and is providing current to the $n^{th}$ node (i.e. in the magnified section 26 of FIG. 1A)

$q_{n,k}=-1$ if the $k^{th}$ current element is directly connected to the nth node and is taking current away from the $n^{th}$ node.

$q_{n,k}=0$ if the $k^{th}$ current element is not directly connected to the $n^{th}$ node.

In the matrix Q, each row corresponds to a specific node 22, and each column corresponds to a specific current element. For the mesh shown in FIG. 1 (where each node is connected to 8 current elements), each row has four (–1) entries, and four (1) entries.

Given the matrix Q, Kirchoff's current law is expressed as:

$$\begin{pmatrix} q_{1,1} & \cdots & q_{1,K} \\ \vdots & \vdots & \vdots \\ q_{N,1} & \cdots & q_{N,K} \end{pmatrix} \begin{pmatrix} i_1 \\ i_2 \\ \vdots \\ i_K \end{pmatrix} = 0, \text{ or equivalently}$$

$$Q * I = 0$$

The magnet design problem according to the present method is now well-defined. The task of designing a magnet according to the present method is succinctly expressed in three equations. The magnet design is solved by performing the following calculation:

Minimize the total power expression:

$$\left(\frac{J}{\sigma_c}\right) \sum_{k=1}^{K} |i_k| L_k,$$

subject to the magnetic field constraint: $(|A*I-B| \leq |EB|)$, and subject to Kirchoff's current law: $Q*I=0$.

The solution to this problem provides the most power-efficient magnet conductor arrangement for the given magnetic fields at the target points, the given magnetic field deviations, and the given current element locations. Similarly, in the case of superconducting magnets, the solution provides the design which requires the shortest length of superconducting wire given the constraints.

This mathematical problem is known as a L1-norm minimization. In order to efficiently find a solution the problem should preferably be converted to a linear programming (LP) problem. There are several known ways of performing this conversion. For example, reference can be made to *Practical Optimization* by P. Gill, W. Murray and M. H. Wright, 1981, London Academic Press for information on L1-norm to LP conversion techniques.

A preferred method of performing the L1-norm to LP conversion starts with making the substitution:

$$t_k \geq |i_k|.$$

Then, this substitution is performed in the constraints so that absolute value signs are removed. The problem is rewritten:

Minimize the expression:

$$\sum_{k=1}^{K} t_k L_k,$$

subject to the constraint:

$$\begin{pmatrix} -1 & 0 & \cdots & 0 & 1 & 0 & \cdots & 0 \\ -1 & 0 & \cdots & \cdots & -1 & 0 & \cdots & \cdots \\ 0 & -1 & \cdots & \cdots & 0 & 1 & \cdots & \cdots \\ 0 & -1 & \cdots & \cdots & 0 & -1 & \cdots & \cdots \\ \cdots & \cdots & \cdots & -1 & \cdots & \cdots & \cdots & 1 \\ 0 & \cdots & \cdots & -1 & 0 & \cdots & \cdots & -1 \\ \hline 0 & & & & & A & & \\ \hline 0 & & & & & -A & & \\ \hline 0 & & & & & Q & & \\ \hline 0 & & & & & -Q & & \end{pmatrix} \begin{pmatrix} t_1 \\ \vdots \\ t_K \\ i_1 \\ \vdots \\ i_K \end{pmatrix} \leq \begin{pmatrix} 0 \\ \hline 0 \\ \hline (e_1+1)b_1 \\ \vdots \\ (e_M+1)b_M \\ \hline (e_1-1)b_1 \\ \vdots \\ (e_M-1)b_M \\ \hline 0 \\ \hline 0 \end{pmatrix}.$$

This very large matrix equation is a solvable LP problem. The solution to this LP problem provides the currents $i_k$ for all the current elements. For many magnet designs, this LP problem may require very large matrices indeed. A useful LP software package called PCx is available from Argonne National Laboratory that can design a MRI gradient coil with hundreds of nodes in about a minute (with a mesh having 1000 current elements).

The method of the present invention picks the minimum number of conductors for the magnet, given the required magnet characteristics (i.e. mesh structure and the fields at target points).

The method of the present invention is particularly well suited for designing gradient coils for MRI applications. This is due in large part to the ability of the present method to accommodate mesh structures having arbitrary shapes and configurations. Sometimes, it is preferable for a gradient coil to have an unusual shape. The method of the present invention can design electromagnets with unusual shape constraints. It is understood that MRI applications typically do not require precise gradient fields. Gradient coils providing only about 10% gradient uniformity are acceptable for some MRI applications. In the present method, the gradient field tolerance is set using the deviation vector E.

Figure 3:
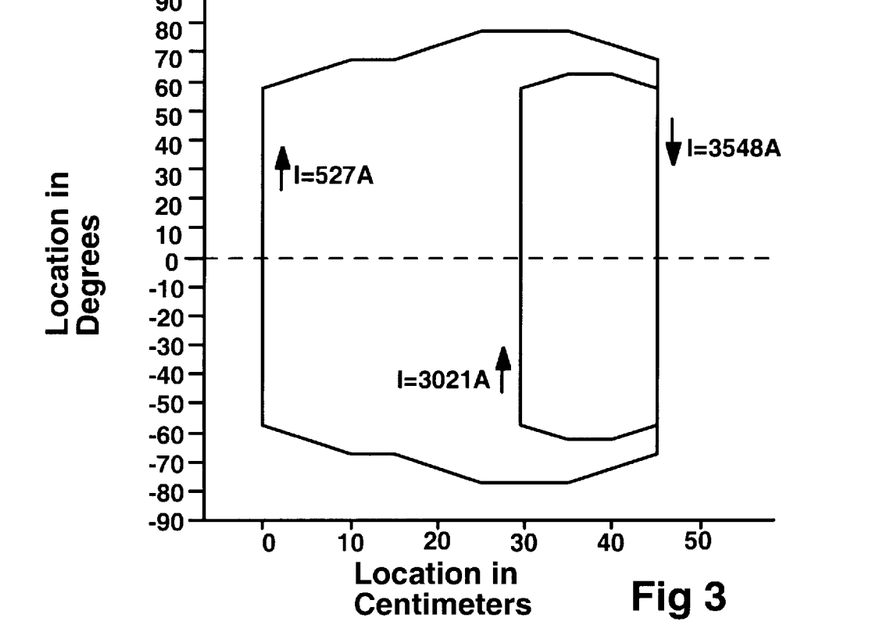
FIG. 3 shows a specific transverse gradient coil design for MRI made using the present method.

FIG. 3 shows a specific gradient coil design made using the present method. In this design, the mesh structure was disposed in a cylindrical shape 80 cm in diameter and having a total length of 90 cm. The currents shown in FIG. 3 are for a gradient strength of 10 milliTesla/Meter. The gradient is uniform to 5% within a sphere 32 cm in diameter centered within the cylinder. It is understood that only a single pair of current loops are shown. The gradient coil has 4 pairs of the current loops shown in FIG. 3 disposed around a cylinder.

Figures 4A, 4B:
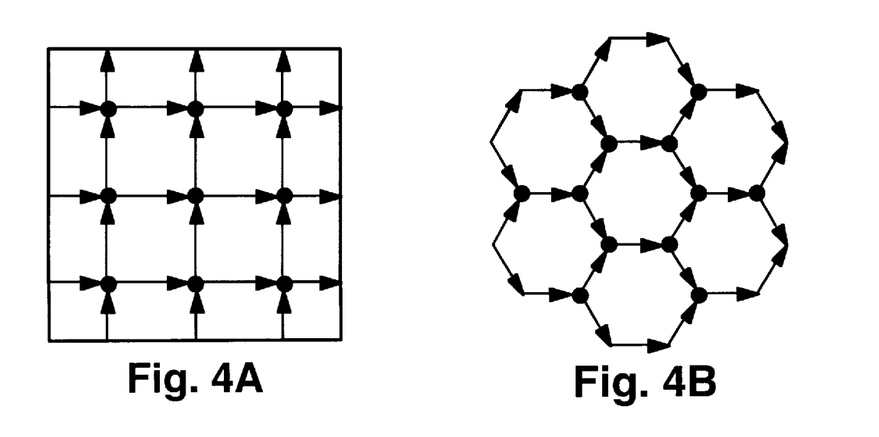
FIGS. 4A, 4B, and 4C show two examples of other mesh structures usable with the present method.
Figure 4C:
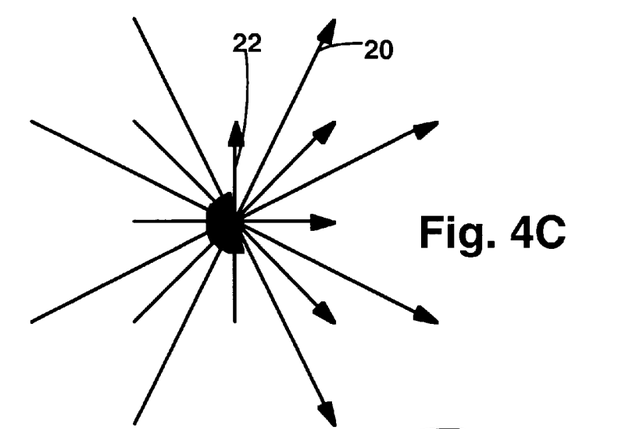

In the particular embodiment of the present method illustrated in FIGS. 1A and 1B, each node is connected to 8 current elements in a rectangular grid with diagonal current elements. This arrangement for the nodes and current elements is entirely optional. Any arrangement of nodes and current elements can be used. FIG. 4A shows a simplified arrangement where each node is only connected to four other nodes connected in a rectangular grid. FIG. 4B shows a alternative arrangement where the nodes are arranged in a hexagonal array. Optionally, three candidate current elements are added to each hexagon connecting the nodes across each hexagon. FIG. 4C shows a single node in an alternative arrangement having nodes in a rectangular array and where each node is connected to 16 other nodes.

Figures 5A, 5B:
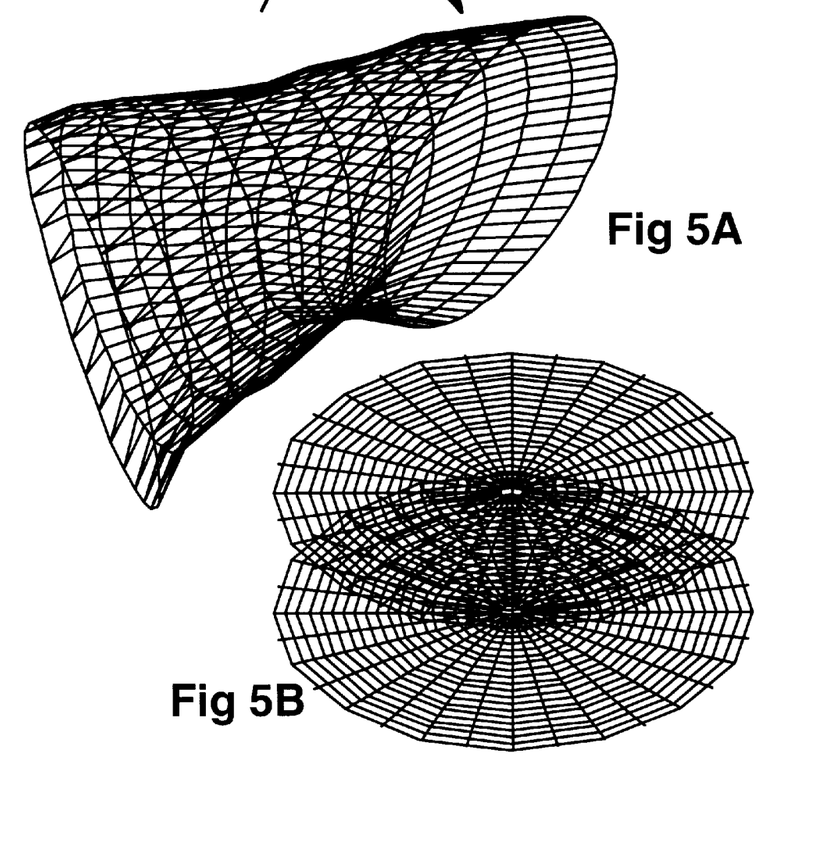
FIG. 5A shows an example of an arbitrary mesh surface compatible with the present method.
FIG. 5B shows an example of a mesh dispoed in two planes which can be used with the present invention.

Also, it is important to note that the mesh does not need to be located on a cylindrical surface. The mesh can be located on a surface of any arbitrary shape. For example, the mesh can be located on a surface that is not rotationally symmetric. FIG. 5A, for example, shows a very arbitrary shape having a mesh that is usable in the present method. Further, the mesh does not need to be constrained to a two-dimensional sheet. The mesh can consist of current elements and current nodes connected in three dimensions. The only requirement of the mesh is that the locations of the current elements and nodes are well defined with respect to the target points. This allows the coefficients $a_{m,k}$ to be determined using the Biot-Savart law. If the coefficients $a_{m,k}$ can be determined, then the present method can be performed. It is noted, as above, that for best results, the target points should be located a certain minimum distance from the current elements and nodes. Generally, the minimum distance scales with the diameter of the conductors used in the magnet. This minimum distance can be about 4–5 times the diameter of the wire used.

FIG. 5B shows an example of a mesh disposed on two planar surfaces. This mesh can be used when designing biplanar magnets. The target points can be located between the planes, or on one side of the planes.

It will be clear to one skilled in the art that the above embodiment may be altered in many ways without departing from the scope of the invention. Accordingly, the scope of the invention should be determined by the following claims and their legal equivalents.

What is claimed is:

1. A method for making an electromagnet, the method comprising the steps of:
    a) defining a mesh of candidate current elements and candidate current nodes, wherein the mesh has K candidate current elements;
    b) defining a plurality of target points and a desired magnetic field for each target point;
    c) defining a power expression proportional to the total power dissipation in all the candidate current elements, wherein the power expression is proportional to the expression:

$$\sum_{k=1}^{K} L_k |i_k|,$$

where $L_k$ is a known length of the $k^{th}$ candidate current element and $i_k$ is an unknown current in the $k^{th}$ candidate current element;
    d) defining for each target point a magnetic field constraint for the maximum allowable magnetic field deviation from the desired magnetic field;
    e) defining a constraint based on Kirchoff's current law, wherein the net current at each node is constrained to be zero;
    f) establishing a calculation equivalent to a $L^1$-norm minimization calculation wherein the power expression is minimized subject to the magnetic field constraint and subject to the Kirchoff's current law constraint;
    g) solving the calculation of step (f) such that the currents $i_k$ for each candidate current element are determined;
    h) constructing at least one magnet conductor for carrying current at a location corresponding to the result of step (f).

2. The method of claim 1 wherein the mesh is disposed on a cylindrical surface.

3. The method of claim 1 wherein the mesh is disposed in 3-dimensional space and is not confined to a two-dimensional surface.

4. The method of claim 1 wherein the mesh comprises a hexagonal array of candidate current elements and candidate current nodes.

5. The method of claim 1 wherein the candidate current elements are curved.

6. The method of claim 1 wherein the candidate current elements are straight.

7. The method of claim 1 wherein step (g) is performed using linear programming on a computer.

8. The method of claim 1 wherein the mesh has more than 100 current elements.

9. The method of claim 1 wherein a distance between any target point and node is at least four times a cross sectional dimension of the magnet conductor.

10. The method of claim 1 wherein the mesh is disposed on two planar surfaces.

11. The method of claim 1 wherein the mesh comprises a rectangular array of candidate current elements and candidate current nodes.

12. The method of claim 11 wherein each candidate current node is connected through candidate current elements to the 8 closest candidate current nodes.

13. The method of claim 1 wherein certain target points have an associated maximum allowable magnetic field.

14. The method of claim 13 wherein the target points having a maximum allowable magnetic field are located outside of a volume defined by the mesh.

* * * * *

UNITED STATES PATENT AND TRADEMARK OFFICE
CERTIFICATE OF CORRECTION

PATENT NO. : 6,067,001
DATED : May 23, 2000
INVENTOR(S) : Xu et al.

It is certified that error appears in the above-identified patent and that said Letters Patent is hereby corrected as shown below:

Title page "[63] Continuation of application No.09/046,946, Mar. 23, 1998" Should be corrected to:

[63] Continuation in part of application No.09/046,946, Mar. 23, 98

Signed and Sealed this

Fifteenth Day of May, 2001

Attest:

NICHOLAS P. GODICI

Attesting Officer     Acting Director of the United States Patent and Trademark Office